United States Patent
Cipolla et al.

(10) Patent No.: US 8,081,473 B2
(45) Date of Patent: Dec. 20, 2011

(54) APPARATUS AND METHOD OF DIRECT WATER COOLING SEVERAL PARALLEL CIRCUIT CARDS EACH CONTAINING SEVERAL CHIP PACKAGES

(75) Inventors: Thomas M. Cipolla, Katonah, NY (US); Evan George Colgan, Chestnut Ridge, NY (US); Paul W. Coteus, Yorktown Heights, NY (US); Shawn Anthony Hall, Pleasantville, NY (US); Shurong Tian, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 586 days.

(21) Appl. No.: 12/185,520

(22) Filed: Aug. 4, 2008

(65) Prior Publication Data

US 2010/0025010 A1 Feb. 4, 2010

(51) Int. Cl.
*H05K 5/00* (2006.01)
*H05K 7/20* (2006.01)
*G06F 1/20* (2006.01)
*F28D 15/00* (2006.01)
*H01L 23/495* (2006.01)

(52) U.S. Cl. .............. 361/719; 361/679.47; 361/679.52; 361/702; 361/679.53; 361/711; 361/721; 165/104.33; 174/15.2; 257/675

(58) Field of Classification Search ............ 361/679.47, 361/679.52, 679.53, 702, 711, 719, 721
See application file for complete search history.

(56) References Cited

U.S. PATENT DOCUMENTS

| | | | |
|---|---|---|---|
| 4,009,423 A | 2/1977 | Wilson | |
| 5,050,037 A | 9/1991 | Yamamoto et al. | |
| 5,829,516 A | 11/1998 | Lavochkin | |
| 6,065,208 A * | 5/2000 | Lamb et al. | 29/890.03 |
| 6,111,749 A * | 8/2000 | Lamb et al. | 361/699 |
| 6,119,765 A * | 9/2000 | Lee | 165/80.3 |
| 6,233,150 B1 * | 5/2001 | Lin et al. | 361/704 |
| 6,297,966 B1 * | 10/2001 | Lee et al. | 361/799 |
| 6,888,719 B1 * | 5/2005 | Janzen et al. | 361/679.31 |
| 7,106,595 B2 * | 9/2006 | Foster et al. | 361/721 |
| 7,151,668 B1 * | 12/2006 | Stathakis | 361/700 |
| 7,289,327 B2 * | 10/2007 | Goodwin et al. | 361/701 |
| 7,400,506 B2 * | 7/2008 | Hoss et al. | 361/715 |
| 7,457,122 B2 * | 11/2008 | Lai et al. | 361/704 |
| 2002/0039282 A1 * | 4/2002 | Han et al. | 361/719 |
| 2003/0026076 A1 * | 2/2003 | Wei | 361/704 |
| 2005/0141199 A1 * | 6/2005 | Chiou et al. | 361/704 |
| 2006/0098409 A1 * | 5/2006 | Cheon | 361/699 |

(Continued)

*Primary Examiner* — Bradley Thomas
(74) *Attorney, Agent, or Firm* — Scully, Scott, Murphy & Presser, P.C.; Daniel P. Morris, Esq.

(57) ABSTRACT

A cooling apparatus, system and like method for an electronic device includes a plurality of heat producing electronic devices affixed to a wiring substrate. A plurality of heat transfer assemblies each include heat spreaders and thermally communicate with the heat producing electronic devices for transferring heat from the heat producing electronic devices to the heat transfer assemblies. The plurality of heat producing electronic devices and respective heat transfer assemblies are positioned on the wiring substrate having the regions overlapping. A heat conduit thermally communicates with the heat transfer assemblies. The heat conduit circulates thermally conductive fluid therethrough in a closed loop for transferring heat to the fluid from the heat transfer assemblies via the heat spreader. A thermally conductive support structure supports the heat conduit and thermally communicates with the heat transfer assemblies via the heat spreader transferring heat to the fluid of the heat conduit from the support structure.

18 Claims, 12 Drawing Sheets

U.S. PATENT DOCUMENTS

| | | | |
|---|---|---|---|
| 2006/0203454 A1* | 9/2006 | Chang | 361/707 |
| 2007/0097627 A1* | 5/2007 | Taylor et al. | 361/689 |
| 2007/0195489 A1* | 8/2007 | Lai et al. | 361/600 |
| 2007/0206359 A1* | 9/2007 | Lai et al. | 361/715 |
| 2007/0217160 A1* | 9/2007 | Legen et al. | 361/704 |
| 2007/0223198 A1* | 9/2007 | Lai et al. | 361/720 |
| 2007/0263359 A1* | 11/2007 | Lai et al. | 361/715 |
| 2007/0263360 A1* | 11/2007 | Lai et al. | 361/719 |
| 2008/0013282 A1* | 1/2008 | Hoss et al. | 361/715 |
| 2008/0101036 A1* | 5/2008 | Chen | 361/720 |
| 2008/0151487 A1* | 6/2008 | Ni et al. | 361/684 |
| 2008/0251911 A1* | 10/2008 | Farnsworth et al. | 257/714 |
| 2008/0259567 A1* | 10/2008 | Campbell et al. | 361/699 |
| 2008/0264613 A1* | 10/2008 | Chu | 165/104.33 |
| 2008/0273307 A1* | 11/2008 | Campbell et al. | 361/699 |
| 2008/0291630 A1* | 11/2008 | Monh et al. | 361/700 |
| 2009/0002951 A1* | 1/2009 | Legen et al. | 361/715 |
| 2009/0034327 A1* | 2/2009 | Yun et al. | 365/174 |
| 2009/0168356 A1* | 7/2009 | Chen et al. | 361/709 |
| 2009/0190303 A1* | 7/2009 | Chu et al. | 361/679.47 |
| 2009/0268408 A1* | 10/2009 | Liu et al. | 361/710 |

* cited by examiner

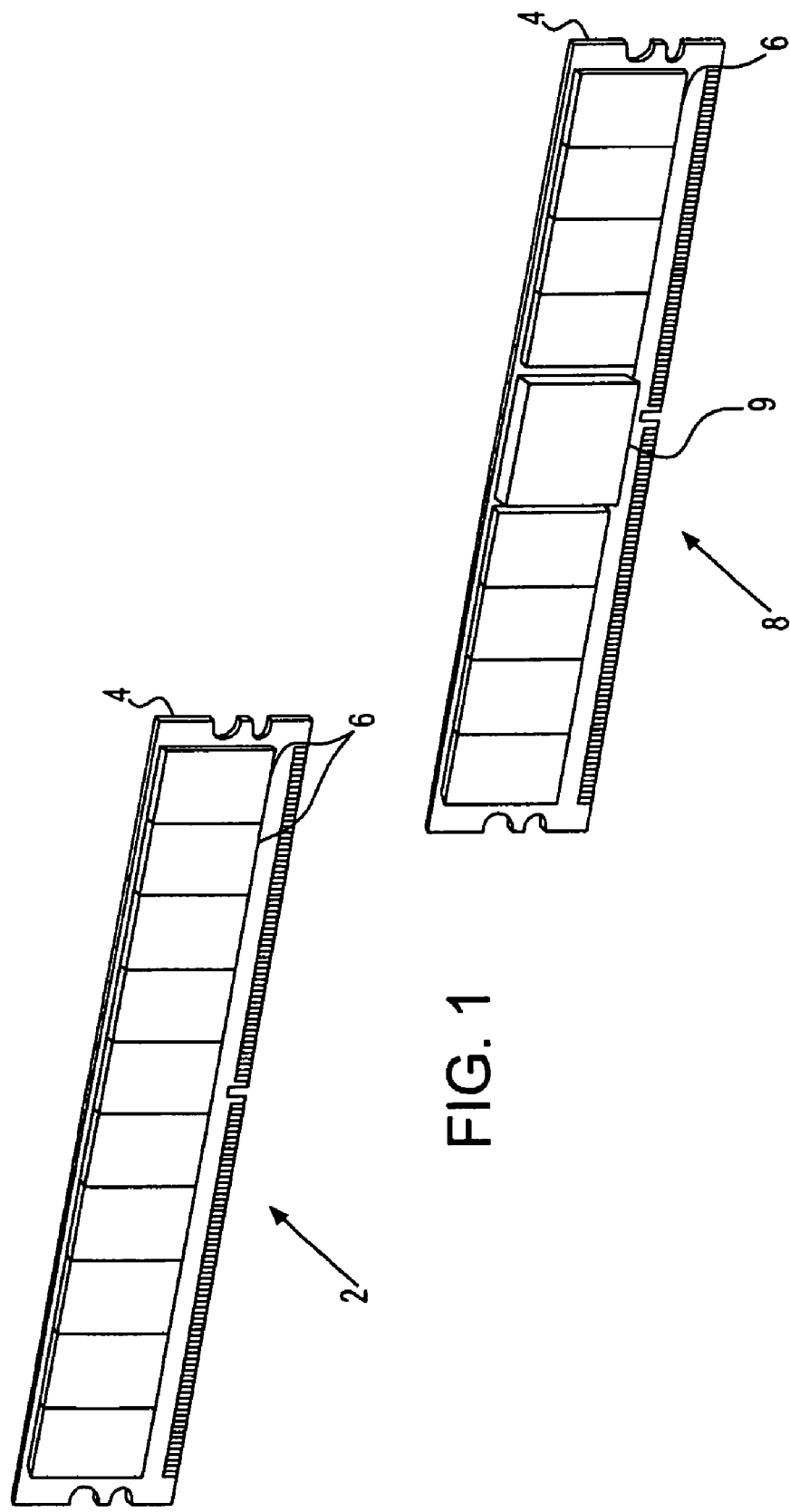

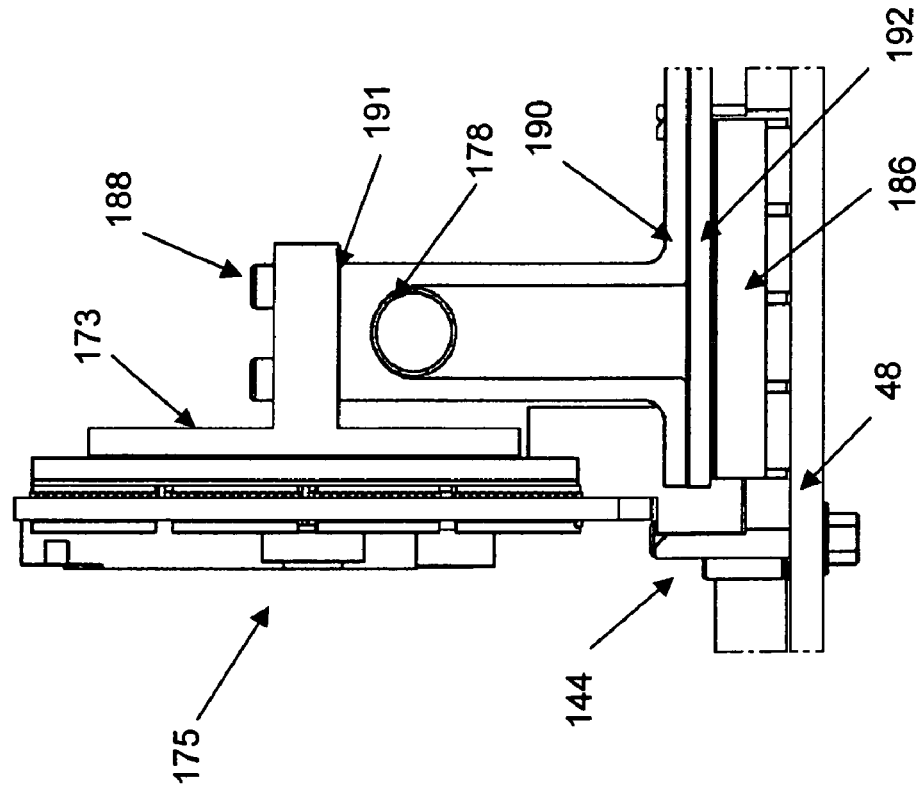
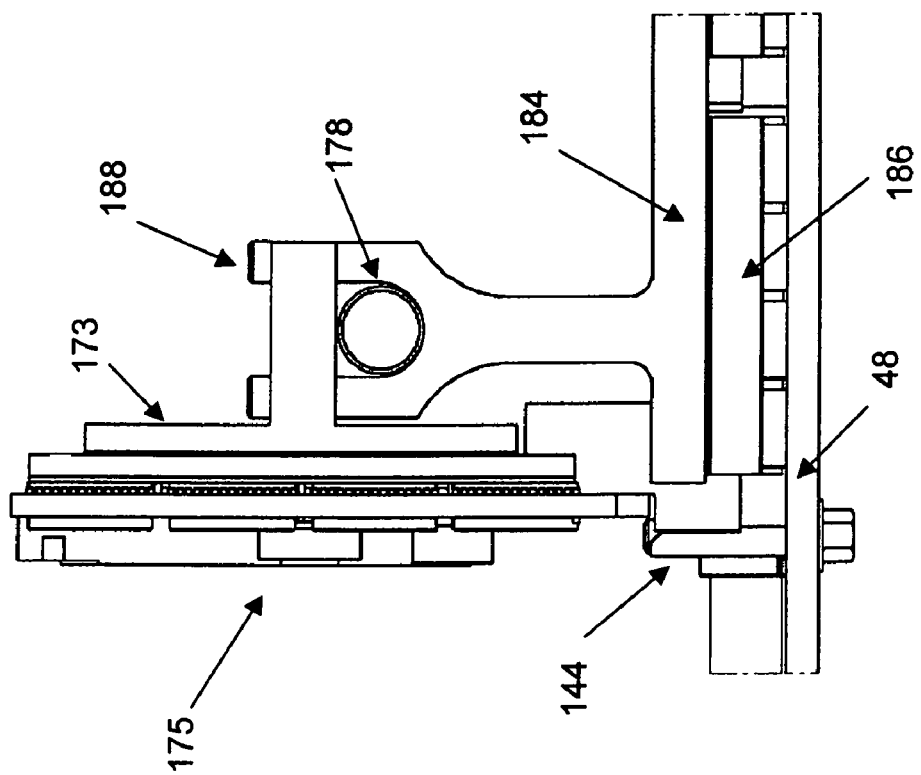
FIG. 11A
FIG. 11B

US 8,081,473 B2

APPARATUS AND METHOD OF DIRECT WATER COOLING SEVERAL PARALLEL CIRCUIT CARDS EACH CONTAINING SEVERAL CHIP PACKAGES

This invention was made with Government support under Contract No.: B554331 awarded by Department of Energy. The Government has certain rights in this invention.

CROSS REFERENCE TO RELATED APPLICATION

This application is related to commonly-owned, co-pending U.S. patent application Ser. No. 12/115,618 filed on May 6, 2008, the entire contents and disclosure of which is expressly incorporated by reference in its entirety.

FIELD OF THE INVENTION

The present invention is related to apparatuses and methods for cooling an electronic device, and more specifically, cooling a heat producing electronic device using heat transfer devices.

BACKGROUND OF THE INVENTION

Cooling for electronic devices, for example, closely spaced electronic circuit cards with nearly uniform height components, such as dual in-line memory modules (DIMMs), has traditionally been accomplished by circulating air. However, in the electronics industry, more powerful circuits are difficult to cool using air cooling and even for relatively low-power devices air cooling can be inadequate. Alternative cooling methods include using a one piece flat sheet metal heat sink. Although such enhancements to air cooling remove additionally heat, they have proved to be inadequate for providing the additional cooling need for more powerful heat producing electronic devices.

Typically, in order to cool known electronic devices air is blown parallel to a plurality of device, such as a plurality of dynamic random access memory (DRAM) modules 6 on a dual inline memory module (DIMM) 2 as shown in FIG. 1, and DRAMs 6 on DIMM 8 as shown in FIG. 2. It is particularly difficult to cool these devices in any other manner, for example water cooling, because the heat produced by the DRAMs is spread evenly over the several DIMMs and there is limited space between them.

Another shortcoming with prior art devices is the inability to conveniently remove and replace a device that is liquid cooled. Liquid cooling typically requires a thermal interface material (TIM) such as a thermal grease or paste to be applied between the device to be cooled and a heat transfer device such as a cold plate or heat sink. The application of this material must be done in a very controlled manner in order to make good thermal contact between the device to be cooled and the cold plate. The level of control needed is usually beyond what can be done in the field, so an individual liquid cooled device cannot easily be replaced in the field. The alternative to breaking the thermal connection to remove a device is to break a liquid connection such as a hose connection. Connections such as these take up a considerable volume of space. While practical for one or a few devices, having an individual liquid disconnect for many devices uses too much room, making this solution impractical. Any such breakable thermal interface must also be actuated is the same direction as the electrical connectors for the component being cooled.

Additionally, another problem in the art is the space requirements within a computer system for attaching electronic components, for example, DIMMs or small compute cards. An additional problem with known cooling systems is being able to cool multiple types of heat producing electronic components which may be asymmetrically positioned within the computer system. A further problem with current cooling systems is that a lengthy cooling conduit in a cooling system is difficult to form and locate with adequate precision. Where possible, it is desirable to use a single serpentine section of pipe with water cooling to minimize the number of joints needed and simplify the fabrication process.

It would therefore be desirable to provide an apparatus and method for using liquid cooling for removing heat from heat producing electronic devices, which may be angularly juxta-positioned within a computer system. It is further desirable to remove heat from electronic devices where the heat producing devices are a concentrated source of heat, such as a circuit card with memory or compute modules. It would also be desirable to provide a method of liquid cooling a plurality of electronics devices such as several parallel circuit cards each containing several chip packages while allowing the circuit cards to be replaced in the field, and further without disturbing any liquid (e.g., water) connections. There is further need for a method of precisely positioning and retaining a lengthy heat conduit relative to the electrical connectors for the devices.

SUMMARY OF THE INVENTION

In an aspect of the invention, a cooling apparatus for an electronic device includes a plurality of heat producing electronic devices affixed to a wiring substrate. The heat producing electronic devices each including outer edges, a raised portion and an unraised portion. A plurality of heat transfer assemblies each include a first thermal interface communicating with the unraised portion and adjacent an outer edge of the heat producing electronic devices. A second thermal interface communicates with the raised portion of the heat producing electronic devices. The second thermal interface has outer edges wherein an outer edge of the second thermal interface and a side outer edge of the heat producing electronic device define a region therebetween on the unraised portion. Heat spreaders are part of the heat transfer assemblies and thermally communicate with and are coupled to the second thermal interfaces of the heat transfer assemblies. The heat transfer assemblies thermally communicate with the heat producing electronic devices for transferring heat from the heat producing electronic devices to the heat transfer assemblies. The plurality of heat producing electronic devices and respective heat transfer assemblies are positioned on the wiring substrate having the regions at least partially overlapping. A heat conduit is thermally communicating with the heat transfer assemblies. The heat conduit circulates thermally conductive fluid therethrough in a closed loop for transferring heat to the fluid from the heat transfer assemblies via the heat spreader.

In a related aspect, the heat producing devices have two sides with chips on both sides and the heat transfer assemblies communicate with one side of the heat producing device. In a further related aspect, the heat generating devices include a raised center portion and two unraised side portions at opposite ends of the heat generating devices. Two first thermal interfaces communicate with the unraised portions and each first thermal interface is adjacent an outer side edge of the heat producing electronic devices. Opposite outer edges of the second thermal interface and the opposite side edges of the heat producing electronic devices defining opposite end regions therebetween. The plurality of heat producing electronic devices and respective heat transfer assemblies are positioned on the wiring substrate having end regions at least partially overlapping.

In a related aspect, a thermally conductive support structure supports the heat conduit. The support structure thermally communicates with the heat transfer assemblies via the heat spreader for transferring heat to the fluid of the heat conduit from the support structure. The support structure and the heat spreaders of the thermal transfer assemblies may mechanically mate and thermally couple for transferring heat from the heat spreaders to the support structure. A clamping device may be positioned on the heat spreader and removably couple with the support structure for applying downward pressure for clamping the heat spreader to the support structure. The heat producing devices may mate electronically with receptacles on the wiring substrate. The clamping devices may be biased to apply pressure when in a locked position to a joint between the heat spreader and the support structure, and a force towards the receptacle such that the mated heat producing devices engage the receptacles without reaching a bottom position. The thermal interfaces between the support structure and the heat spreaders may be planar. The heat conduit may be a serpentine pipe, and the serpentine pipe and the support structure may wind between rows of heat transfer assemblies coupled to heat producing devices. Further, the support structure may capture the heat conduit in a channel in the support structure.

In another related aspect, the heat producing electronic devices are first heat producing electronic devices, and the apparatus further includes: a plurality of second heat producing electronic devices affixed to the wiring substrate and the support structure thermally communicating with the second heat producing electronic devices for transferring heat to the circulating fluid from the support structure. Thermal interface elements may be between the heat producing elements and the first thermal interface and between the first thermal interface and the heat spreader. Thermal interface elements may be between the heat spreader and the support structure. Alternatively, the heat transfer assemblies may face in opposite directions in relation to their adjacent heat transfer assemblies in a row of heat transfer assemblies.

In another aspect of the invention, a cooling system for an electronic device comprises: a plurality of first heat producing electronic devices affixed to a wiring substrate, the first heat producing electronic devices each including outer edges, a raised portion and an unraised portion; a plurality of second heat producing electronic devices affixed to the wiring substrate and being angularly juxtapositioned with the first heat producing electronic devices; a plurality of heat transfer assemblies each including a first thermal interface communicating with the unraised portion and adjacent an outer edge of the first heat producing electronic devices, and a second thermal interface communicating with the raised portion of the first heat producing electronic devices, the second thermal interface having outer edges wherein an outer edge of the second thermal interface and a side outer edge of the first heat producing electronic device define a region therebetween on the unraised portion; heat spreaders being part of the heat transfer assemblies and thermally communicating with and coupling to the second thermal interfaces of the heat transfer assemblies, the heat transfer assemblies thermally communicating with the first heat producing electronic devices for transferring heat from the first heat producing electronic devices to the heat transfer assemblies, the plurality of first heat producing electronic devices and respective heat transfer assemblies being positioned on the wiring substrate having the regions at least partially overlapping; a heat conduit thermally communicating with the heat transfer assemblies, the heat conduit circulating thermally conductive fluid therethrough in a closed loop for transferring heat to the fluid from the heat transfer assemblies via the heat spreader; and a thermally conductive support structure supporting the heat conduit, the support structure thermally communicating with the heat transfer assemblies via the heat spreader for transferring heat to the fluid of the heat conduit from the support structure, and the support structure and the heat spreaders of the thermal transfer assemblies mechanically mating and thermally coupling for transferring heat from the heat spreaders to the support structure, the support structure being positioned over the second heat producing electronic devices and thermally communicating with the second heat producing electronic devices for transferring heat to the fluid from the support structure.

In a related aspect, the first heat producing devices mate electronically with receptacles on the wiring substrate, and the clamping devices are biased to apply pressure when in a locked position to a joint between the heat spreader and the support structure and applying a force towards the receptacle such that the mated heat producing devices engage the receptacles without reaching a bottom position. Further, the heat conduit and the support structure wind between rows of heat transfer assemblies coupled to first heat producing devices.

In another aspect of the invention, a system for supporting a heat conduit for cooling electronic devices comprises: a plurality of heat producing electronic devices affixed to a wiring substrate; a plurality of heat transfer assemblies each including a heat spreader thermally communicating with and coupling to the heat producing electronic devices for transferring heat from the heat producing electronic devices to the heat transfer assemblies, the plurality of heat producing electronic devices and respective heat transfer assemblies being positioned on the wiring substrate; a heat conduit thermally communicating with the heat transfer assemblies, the heat conduit circulating thermally conductive fluid therethrough in a closed loop for transferring heat to the fluid from the heat transfer assemblies; and a thermally conductive support structure supporting the heat conduit, the support structure thermally communicating with the heat transfer assemblies for transferring heat to the fluid of the heat conduit from the support structure, and the support structure and the heat spreaders of the thermal transfer assemblies mechanically mating and thermally coupling for transferring heat from the heat spreaders to the support structure, the heat conduit and the support structure wind between rows of heat transfer assemblies coupled to heat producing devices and the support structure captures the heat conduit in a channel in the support structure.

In a related aspect, the system further includes a plurality of second heat producing electronic devices affixed to the wiring substrate and being angularly juxtapositioned with the first heat producing electronic devices and the support structure being positioned over the second heat producing electronic devices and thermally communicating with the second heat producing electronic devices for transferring heat to the fluid from the support structure. The channel in the support structure may face upward or downward.

In another aspect of the invention, a method for cooling an electronic device, comprises: providing a plurality of first heat producing electronic devices affixed to a wiring substrate; providing a plurality of second heat producing electronic devices affixed to the wiring substrate and being angularly juxtapositioned with the first heat producing electronic devices; providing a plurality of heat transfer assemblies each including a first thermal interface communicating with a portion of the first heat producing electronic devices, and a second thermal interface communicating with another portion of the first heat producing electronic devices, the second thermal interface having outer edges wherein an outer edge of the second thermal interface and a side outer edge of the first heat producing electronic device define a region therebetween, heat spreaders being part of the heat transfer assemblies and thermally communicating with and coupling to the second thermal interfaces of the heat transfer assemblies, the heat transfer assemblies thermally communicating with the first heat producing electronic devices for transferring heat from the first heat producing electronic devices to the heat transfer assemblies, positioning the plurality of first heat producing electronic devices and respective heat transfer assemblies on the wiring substrate; overlapping, at least partially, the regions of the first heat producing electronic devices; positioning a heat conduit in thermal communication with the heat transfer assemblies; circulating thermally conductive fluid through the heat conduit in a closed loop for transferring heat to the fluid from the heat transfer assemblies via the heat spreader; and positioning a thermally conductive support structure under the heat conduit, the support structure thermally communicating with the heat transfer assemblies via the heat spreader for transferring heat to the fluid of the heat conduit from the support structure; coupling, mechanically and thermally, the support structure and the heat spreaders of the thermal transfer assemblies for transferring heat from the heat spreaders to the support structure; and positioning the support structure over the second heat producing electronic devices and thermally communicating with the second heat producing electronic devices for transferring heat to the fluid from the support structure.

BRIEF DESCRIPTION OF THE DRAWINGS

These and other objects, features and advantages of the present invention will become apparent from the following detailed description of illustrative embodiments thereof which is to be read in connection with the accompanying drawings, in which:

FIG. 1 is a perspective view illustrating a typical dual in-line memory module (DIMM) containing several dynamic random access memory (DRAM) chips;

FIG. 2 is a perspective view illustrating another typical dual in-line memory module (DIMM) that contains a controller chip which is a different size from the dynamic random access memory (DRAM) chips;

FIG. 11A is a side elevational view showing details of the water pipe and support structure shown in FIG. 10;

FIG. 11B is a side elevational view showing details of the water pipe and an alternative embodiment of a support structure;

DETAILED DESCRIPTION OF THE INVENTION

Illustrative embodiments of the present invention are described herein with reference to FIGS. 1-13 for apparatuses, systems and methods of cooling heat producing electronic devices. The present invention provides cooling for several parallel circuit cards including chip packages while allowing the circuit cards to be replaced in the field and further without disturbing any fluid or liquid (e.g., water) connections.

Referring to FIG. 1, an illustrative embodiment of a heat producing electronic device is a dual in-line memory module (DIMM) 2 that is used in computers. The DIMM includes a circuit card 4 and several dynamic random access memory chips (DRAMs) 6. Several of these DIMMs 2 are typically plugged into a computer processor printed circuit board in a parallel manner and in close proximity to each other, typically about 12 mm apart.

Figure 3B:
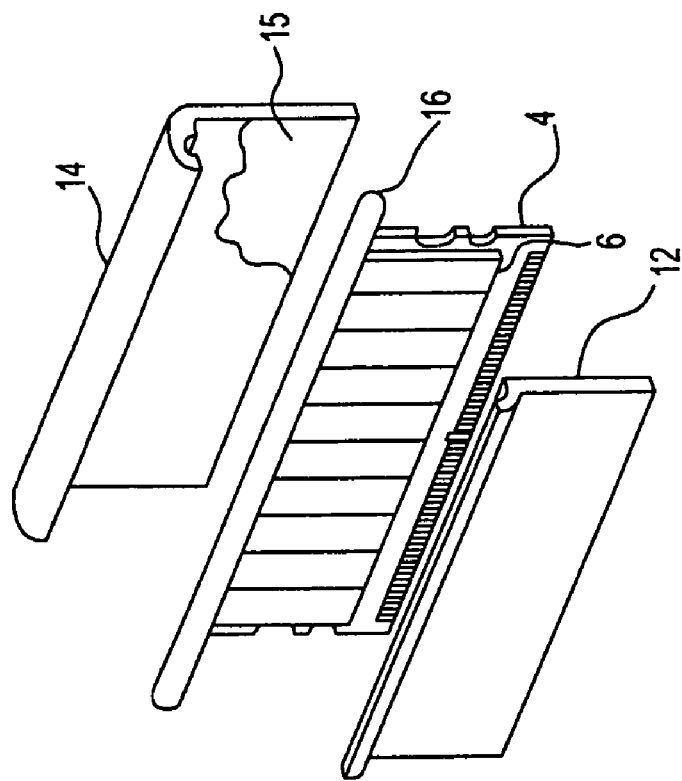
FIGS. 3A and 3B are perspective views illustrating a DIMM as shown in FIG. 1 to which has been added a heat spreader and a heat pipe according to the invention.
Figure 3A:
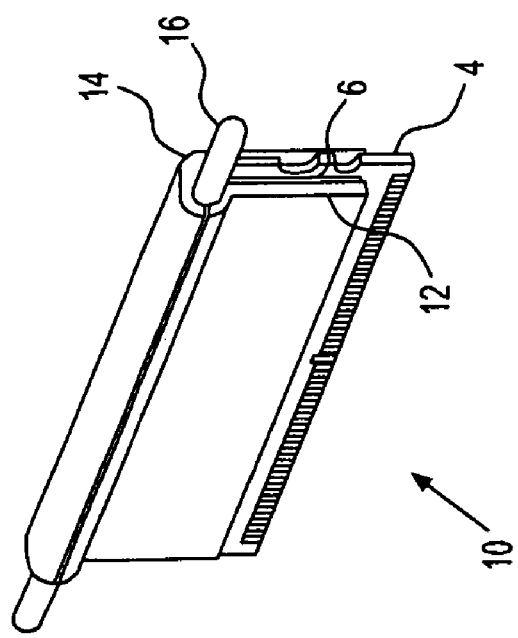

Another embodiment of a DIMM 8 is shown in FIG. 2, wherein in addition to the DRAMs 6, a memory controller chip package 9 is added to the circuit card 4. This DIMM 8 may be used for higher-performance memory systems. Referring to FIGS. 3A and 3B, a DIMM 10 is assembled with a heat transfer device embodied as heat spreaders 12 and 14 and a heat conduit embodied as a heat pipe 16. The components, heat spreaders 12, 14, are shown separated in the exploded view in FIG. 3B. Other embodiments of heat transfer devices and heat conduits may be used and may include, heat sinks and heat conductors, e.g., metal conductors or heat conductor devices including a liquid for conduction. Alternative embodiments of heat transfer devices and heat conduits are discussed herein and shown in the accompanying figures. In order for heat to be efficiently transferred from the DRAMS 6 to the heat spreaders 12 and 14, a thermal interface material, such as a filled silicone, epoxy, or other filled polymer adhesive 15 shown in FIG. 3B is used. The heat spreaders 12, 14 may be attached to the DRAM 6 using a high-thermal-conductivity filled adhesive. The application of the thermal adhesive 15 is carefully controlled, and typically impractical in the field. As an alternative, a non-rigid thermal adhesive or a compliant thermal interface material (TIM) such as a pad or gap fill material may be used between the DRAM 6 and the heat spreaders 12, 14.

Similarly, the heat pipe 16 and heat spreaders 12, 14 also have a thermal interface material (not shown) between them for enhancing heat transfer. For example, thermally conductive oils or pastes, cured or partially cured filled polymers, phase change materials, etc., may be used for enhancing heat transfer. A thermally conductive epoxy adhesive could be used as well.

In the case where a DIMM 8 has a memory controller chip package 9 attached (FIG. 2), the surfaces of the controller chip 9 and the DRAMs 6 may be at different heights. While heat spreaders such as 12, 14 can be modified by machining to accommodate the differences in heights, an alternative means is to use several different heat spreaders such as 18, 20, 22, and 24 shown in FIGS. 4A and 4B. Referring to FIGS. 3A, 3B, and 5, the heat pipe 16 transfers heat between the heat spreaders 12, 14 and a water jacket 32 by the evaporation and condensation of an internal working fluid, e.g., water, ethanol, or acetone.

Figure 6B:
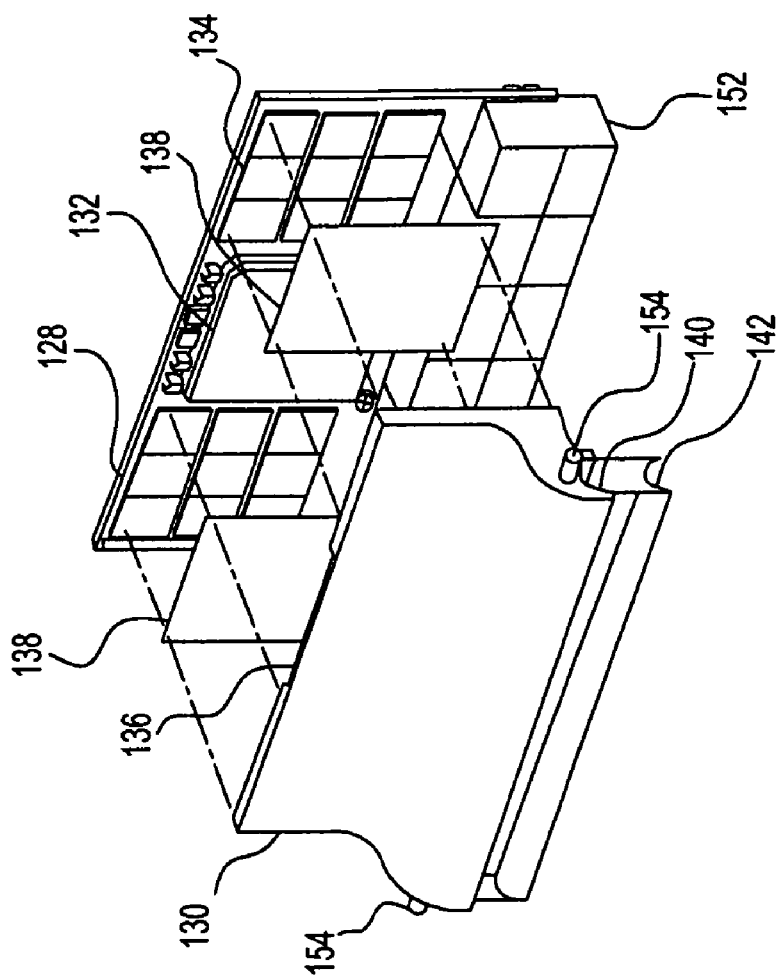
FIGS. 6A and 6B are perspective views illustrating a circuit card with multiple chip packages having different heights and a heat spreader.
Figure 6A:
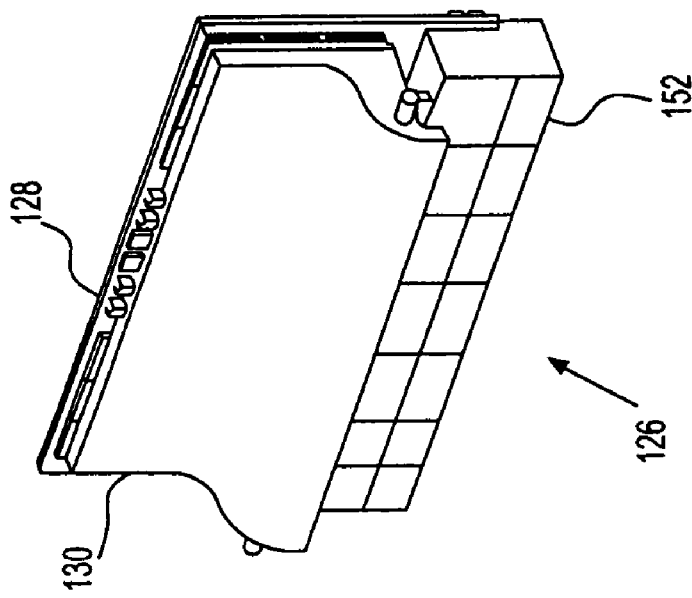

Referring to FIGS. 6A and 6B, a circuit card 128 includes a mounted heat spreader 130. The circuit card 128 also includes one or more chip packages 132 that are higher than other chip packages 134 which require cooling. Other cards may be used that have one or more chip heights requiring heat removal. In the circuit card 8 shown in FIG. 4B, a different heat spreader was used for each group of chip packages of a particular nominal height. A single heat spreader 130 is shown in FIGS. 6A and 6B for chip package groups of more than one height. The chip package 132 is higher than chip packages 134. A portion of heat spreader 130 has been removed to form depression 136. The depth of depression 136 is nominally equal to, or less than, the difference in height of chip 132 and 134. Typically, the power densities and cooling requirements are different for different chips. For example, chip 132 could be a CPU (central processing unit) with a high power density and chips 134 could be DRAM with a much lower power density. The required thermal resistance to provide adequate cooling will depend on the power density and required chip junction temperature. When a common heat spreader is used for multiple chips on a card, it is desirable to only rigidly attach the heat spreader to one chip, preferably in the center, to minimize any potential stress during thermal cycling from TCE (thermal coefficient of expansion) mismatch between the substrate and the heat spreader. Therefore, a compliant thermal interface material (TIM) is needed for the remaining chips. For example, for the case shown in FIG. 6B, if the heat spreader 130 is rigidly attached to the chip 132 using a thermally conductive adhesive material such as silver epoxy, or other filled polymer adhesives, the heat spreader 130 is compliantly attached to the remaining chips 134 using a thermal pad or gap fill material 138, for example, filled silicone material such as Sarcon®. Suitable materials are available up to 2 millimeters thick and can compress up to 90%. Depending on the thermal requirements, a depression 136 may not be required in the heat spreader 130. For very large heat spreaders 130 such as shown in FIGS. 6A and 6B, the heat spreader 130 is also attached to the circuit card 128 using fasteners (not shown). The purpose of this is to transfer forces to the circuit card 128 if the card assembly were to be dropped. Otherwise, the forces would overstress the solder connection of chip package 132 to card 128. The heat spreader 130 also has a semicircular notch 140 to which a layer of gap fill material 142 is can be applied. The circuit card 128 with the assembled heat spreader 130 is illustrated in FIG. 6A as circuit card assembly 126. The assembly of circuit card assembly 126 is done in a controlled environment (as opposed to the field) so the application of the thermal interface materials (thermal adhesive and gap fill material between the heat spreader 130 and the chips 132 and 134) can be done under controlled conditions.

Figure 7:
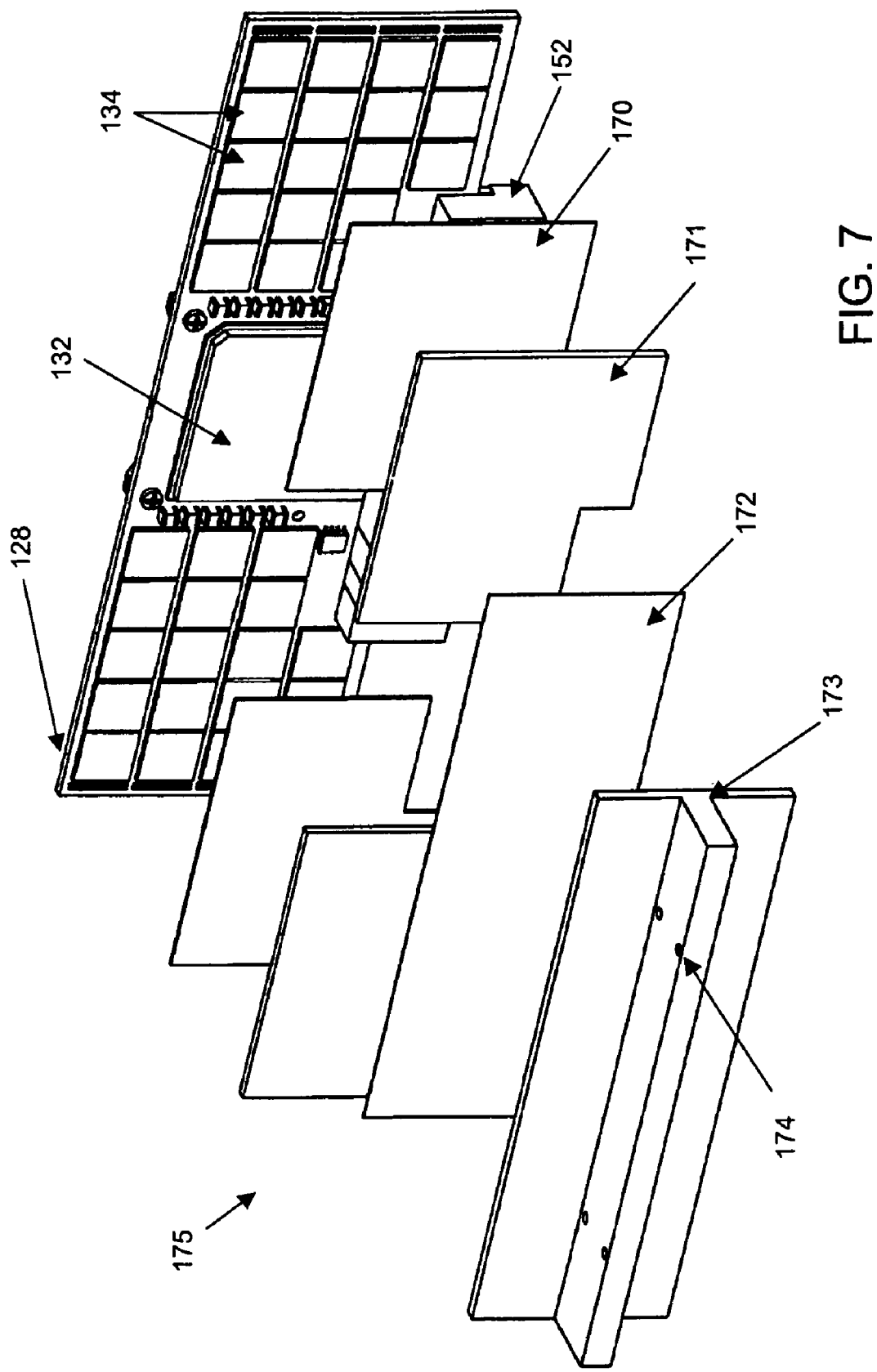
FIG. 7 is a perspective exploded view illustrating a circuit card as in FIGS. 6A and 6B with a circuit card assembly having a heat spreader.

Referring to FIG. 7, a cooling apparatus according to the invention, and related system and method incarnations, includes a heat transfer assembly embodied as a circuit card assembly 175. The circuit card assembly 175 includes a circuit card 128 having mounted heat transfer devices embodied as beat spreaders 173 and 171. The circuit card assembly 175 uses some of the same components as circuit card assembly 126 in FIGS. 6A, 6B wherein like components have the same reference numbers. The circuit card 128 has one or more chip packages 132 that are higher than other chip packages 134, wherein all the chip packages 132, 134 require cooling. In the embodiment shown in FIG. 7 the circuit card 128 is embodied as a compute card, but could be any card that has one or several chip heights and many chips requiring removal of heat. Electrical connections are made between circuit card assembly 175 and mother board 48 (see FIG. 10), for example, by pin and socket connectors contained in headers 152 (FIG. 7) and receptacles 144 (FIG. 10), which are suitable for high speed signals and a greater signal density than a simple DIMM connector can provide.

Figure 4B:
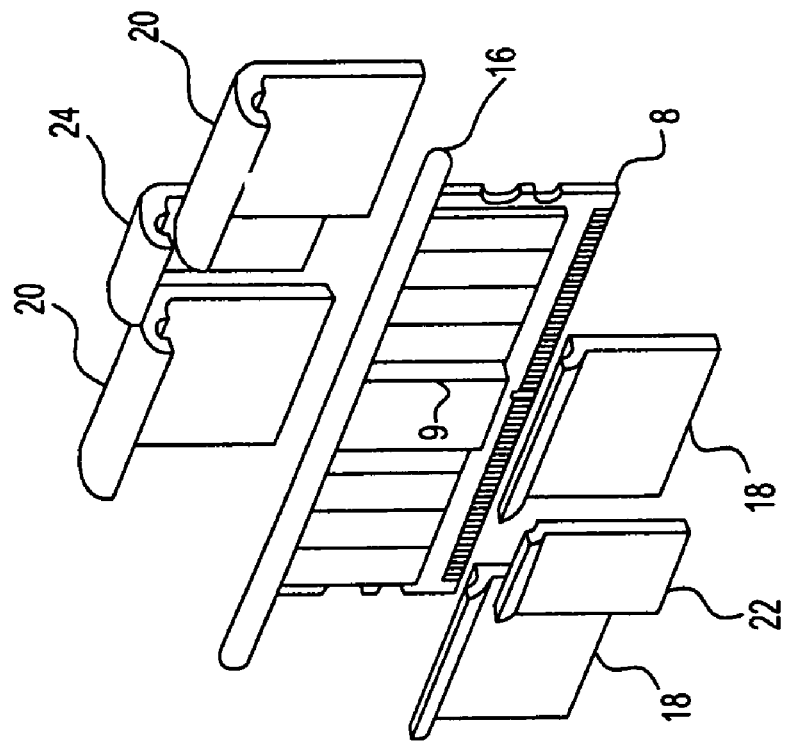
FIG. 4B is a perspective exploded view of the assembly shown in FIG. 4A.
Figure 4A:
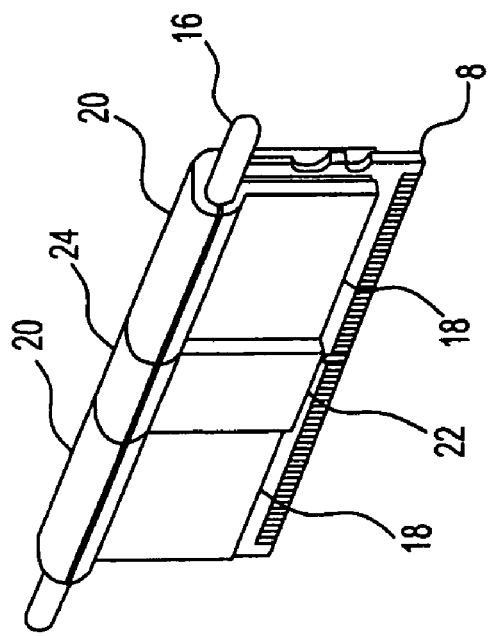
FIG. 4A is a perspective views illustrating a DIMM as shown in FIG. 2 with added heat spreaders to accommodate several chip package heights and a heat pipe according to the invention.
Figure 5:
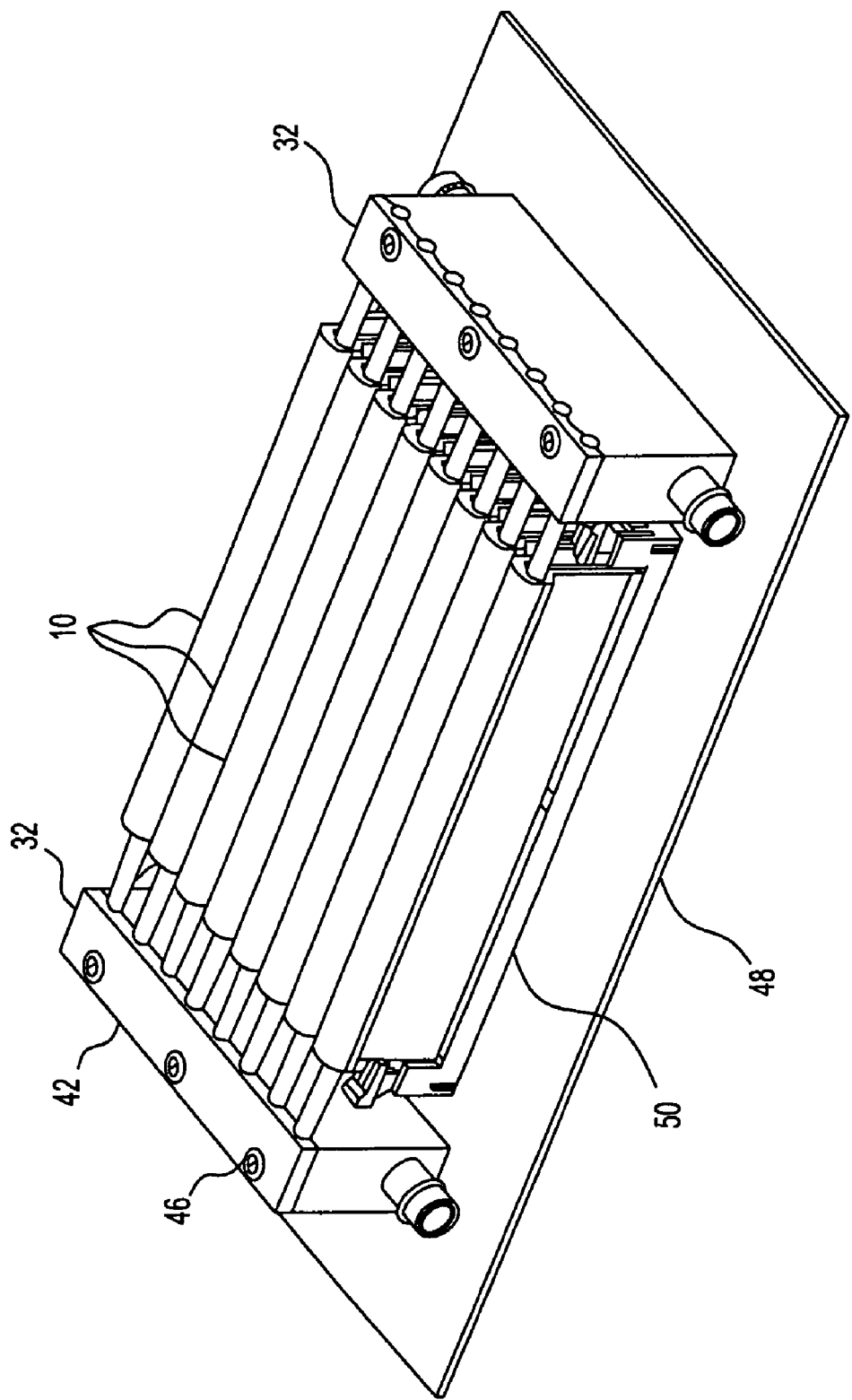
FIG. 5 is a perspective view illustrating a printed circuit board having plugged in DIMMs and heat pipe retainers.

In contrast to the approach used in circuit card 8 shown in FIG. 4B, where a different heat spreader was used for each group of chip packages of a particular nominal height, or the approach used in circuit card assembly 126 shown in FIGS. 6A, 6B where a depression 136 was formed in the heat spreader 130 to accommodate the height difference between the chip packages 132 and 134, in FIG. 7 first DRAM heat spreaders 171 are applied over chip packages 134 using thermal interface material 170. The thermal interface material 170 could be either a rigid or compliant material such as a high-thermal-conductivity filled adhesive, or alternatively a non-rigid thermal adhesive or a compliant thermal interface material (TIM) such as a pad or gap fill material. A second heat spreader 173 is then attached to the lid of chip package 132 and the top surfaces of the DRAM heat spreaders 171 using another thermal interface material 172. Referring to FIG. 7, the thermal interface material 172 is shown as being a single material but the use of one material over the lid of chip package 132 and a different thermal interface material over the DRAM heat spreaders 171 may also be used. The DRAM heat spreaders 171 are attached to the chip packages 134 with a compliant material and the top surface of the DRAM heat spreader 171 are level with, or slightly below, the top surface of chip package 132. The heat spreader 173 is attached to the top surface of the chip package 132 with a conductive adhesive material, which could be rigid, and the heat spreader 173 is compliantly attached to the DRAM heat spreaders 171 using a thermal pad or gap fill material. The use of the DRAM heat spreaders 171 allows the heat spreader 173 to be reduced in size as it does not need to extend over the whole area of card 128 which is populated with chip packages 132 or 134. The reduction in size of the heat spreader 173 allows the circuit card assemblies 175 to overlap each other on a mother card 48 (shown in FIG. 8), as will be described in more detail below.

Figure 8:
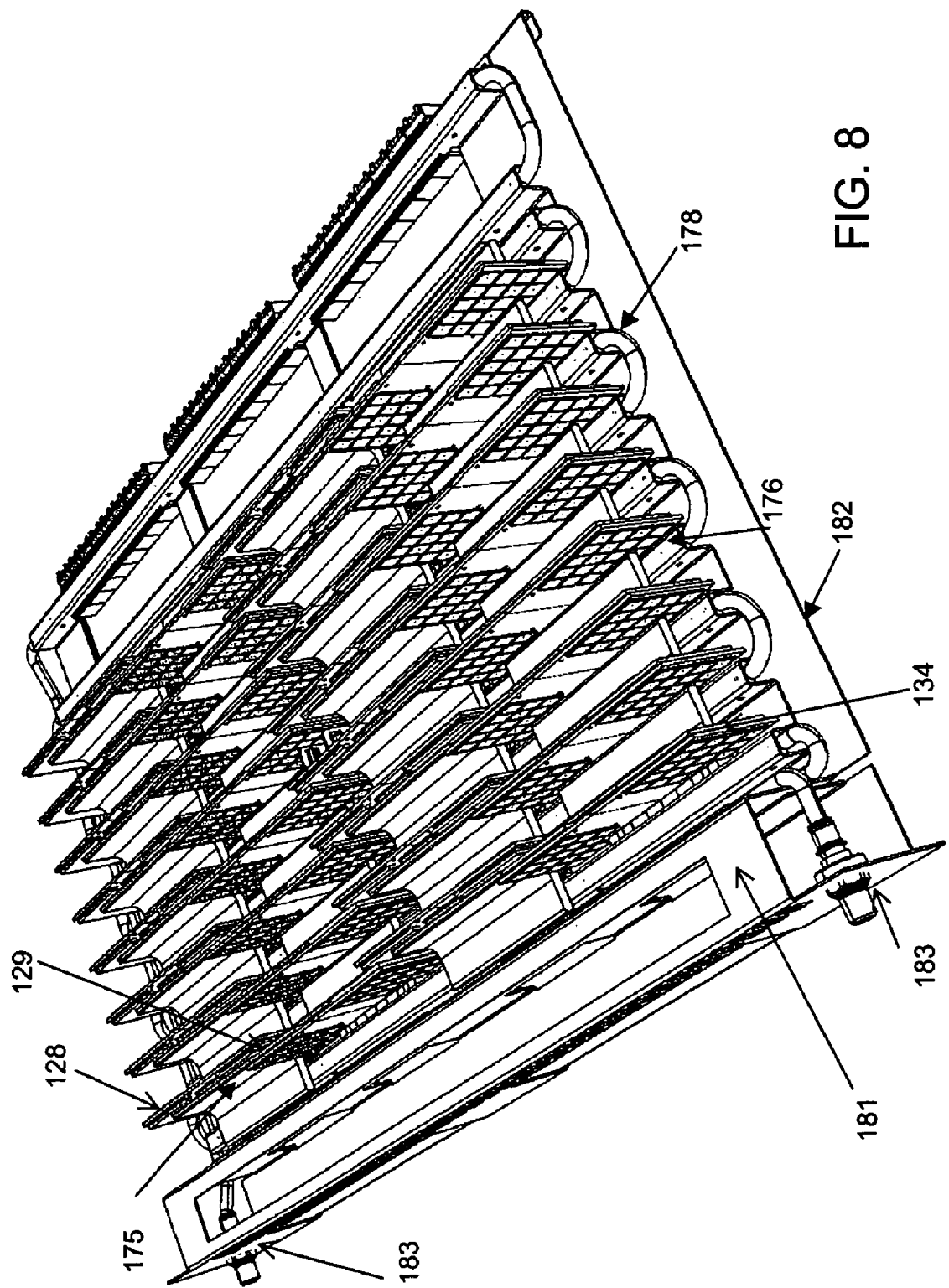
FIG. 8 is a perspective view illustrating an embodiment of the present invention where a water pipe is contained within a support structure, and the heat spreader in contact with the support structure.
Figure 9:
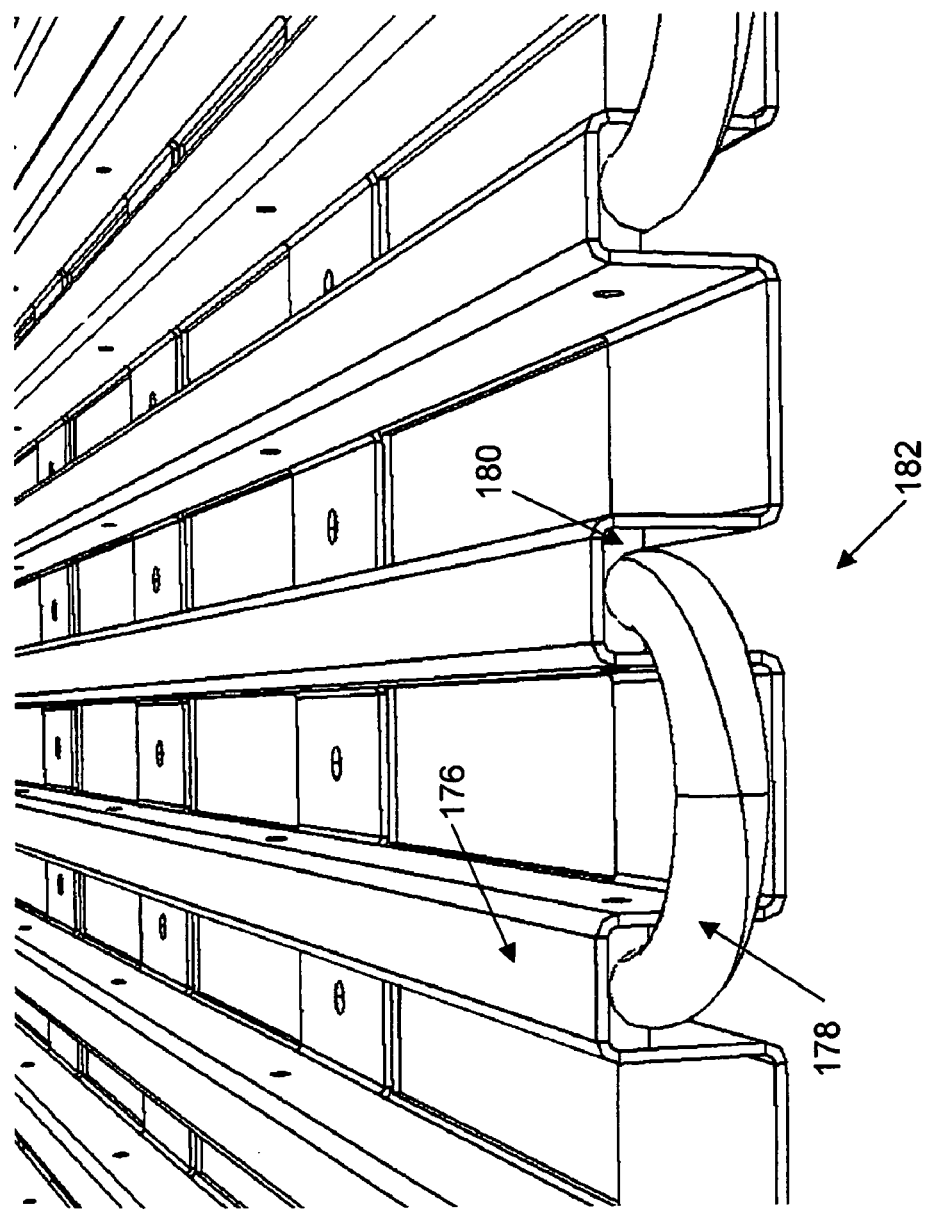
FIG. 9 is a perspective side view of FIG. 8 illustrating the water pipe and the support structure.
Figure 10:
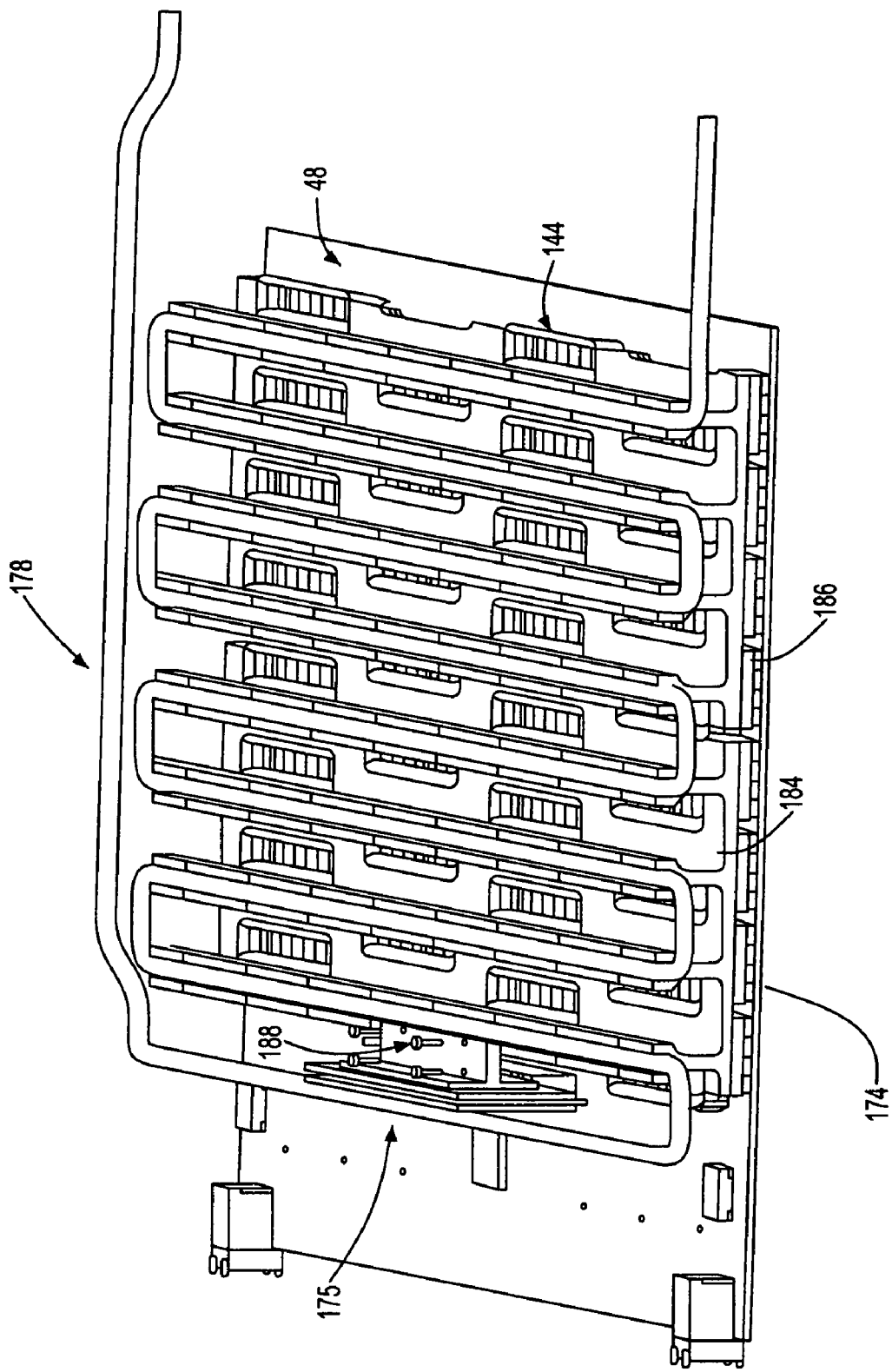
FIG. 10 is a perspective view illustrating another embodiment of the present invention where the water pipe is contained within a support structure, and the heat spreader in contact with the support structure.

Another embodiment of the invention, referring to FIGS. 8 and 9, includes an array of circuit card assemblies 175 plugged into their respective connectors on the mother card 48 (shown in FIG. 10). A heat conduit is embodied as a serpentine water pipe 178 which is held and supported in a folded metal support structure 176. The support structure 176 is attached to a node support structure 182. The serpentine water cooling pipe 178 is attached to the folded metal support structure 176 by thermal interface material 180 (FIG. 9) which is preferably solder, but could also be a filled polymer or other thermally conductive material. The folded metal support structure 176 allows for relaxed tolerances when bending the serpentine water pipe 178 and provides a flat surface for the thermal interface to the heat spreader 173. As described above, a thermal interface material, preferably a compliant non-adhesive material such as a thermal pad or gap fill material, can be used between the heat spreader 173 and the folded metal support structure 176 to lower the thermal resistance. The use of a flat thermal interface between the support structure 176 and the heat spreader 173 reduces the alignment tolerances between the locations of the connectors 144 for the circuit card assemblies and the thermal interfaces.

Figure 13:
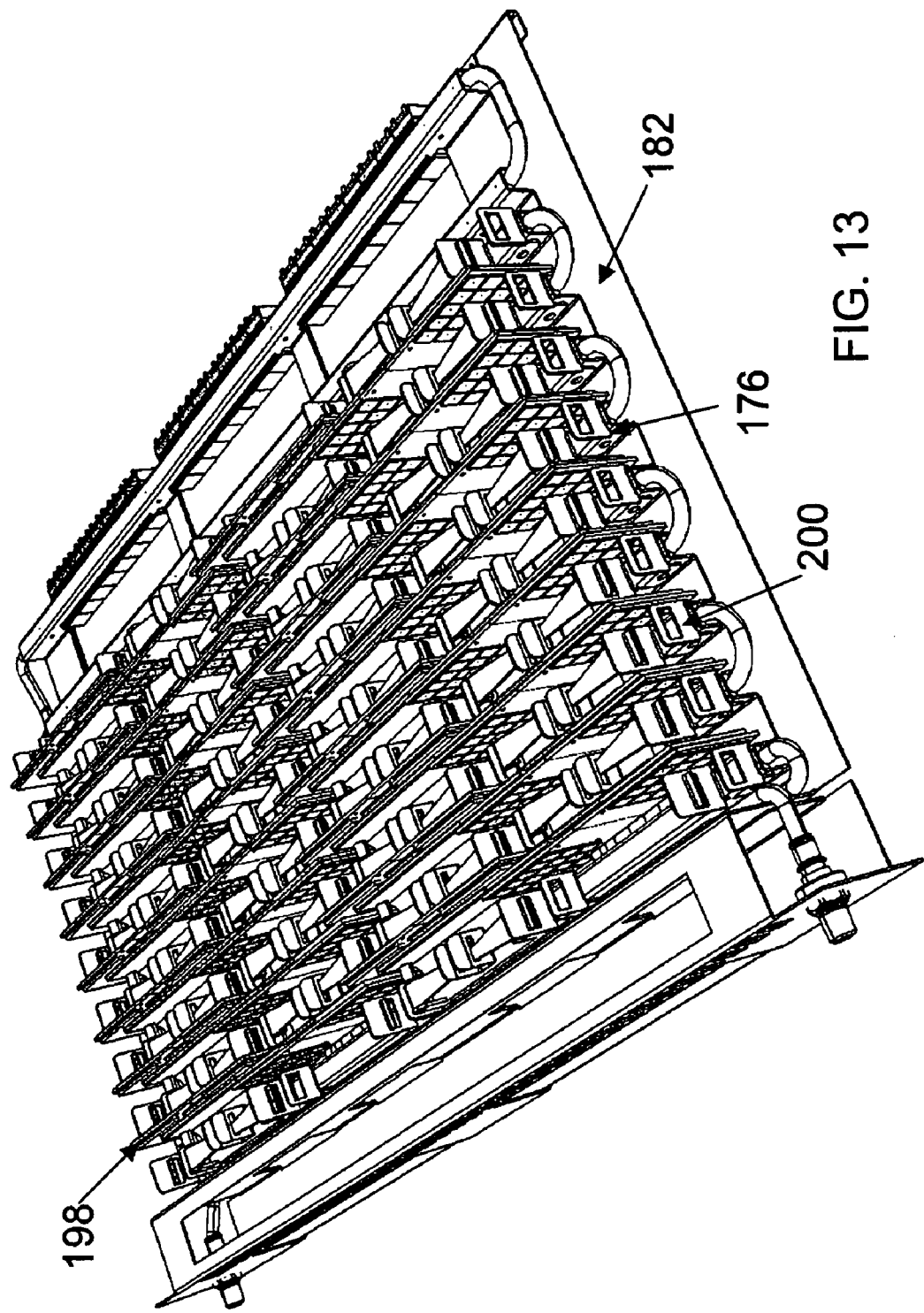
FIG. 13 is a perspective view of another embodiment according to the invention including the integrated individual latching mechanisms and circuit card assembly shown in FIG. 12, wherein the latching mechanisms are securing the circuit card assemblies to the support structure shown in FIGS. 8 and 9.

Referring to FIG. 8, the ends of the circuit card assemblies 175 overlap, which allows for a more compact and lower cost mother card 48 (shown in FIG. 10) and compute rack (not shown). An overlapping region 129 is located between adjacent circuit card assemblies 175 which are located along the same row between parallel straight sections of the serpentine pipe 178. A portion of the chip packages 134 on the surface of the circuit card assembly with the heat spreader 173 are overlapped along the direction of the straight segments of the serpentine pipe 178 with chip packages 134 on the surface without the heat spreader 173 of an adjoining circuit card assembly. In FIG. 8, for a given row of circuit card assemblies 175 plugged into their connectors, note that the direction which the heat spreader 173 face alternates, with some of the circuit card assemblies 175 being thermally connected to the serpentine pipe 178 on one side of the row of circuit card assemblies 175, and some thermally connected to the serpentine pipe 178 on the other side. A similar arrangement is shown in FIG. 13 and used in FIG. 10. One embodiment of the invention has the circuit card assemblies 175 alternate which way they face (i.e., which serpentine pipe they are thermally connected to), but it is also possible to have them not alternate directions by sufficiently offsetting the circuit card assemblies 175, and alternating the distance between the connector 144 and the pipe support structure. The circuit card assemblies 175 allow for overlapping by having the portion of the heat spreader 173 which makes thermal contact with the folded metal support structure 176 not extend the entire length of circuit card 128, as shown in FIGS. 7 and 8. DRAM packages 134 are also attached to the back surface of circuit card assembly 175, as shown in FIG. 8, and can be cooled by conducting heat through the circuit card 128 since the power density is low. In this configuration, the cooling path for the heat generated by chip packages 132 and 134 on the front surface of circuit card assembly 175 extends through the heat spreaders 171 and 173, through the folded metal support structure 176, and then to the serpentine water pipe 178. The support structure 176 is connected to a header 181 for connecting to and supporting couplings 183. The couplings 183 connect to a fluid source and return for fluid circulation. A range of circulating cooling fluids may be used instead of water.

Another embodiment according to the invention, referring to FIGS. 10, 11A and 11B, includes the circuit card assembly 175 plugged into connectors 144 on a mother card 48 or an alternative embodiment of a wiring substrate. The serpentine water pipe 178 is contained in an extruded, or cast, metal support structure 184 having an upward facing channel receiving the water pipe 178, FIGS. 10 & 11A. The serpentine water cooling pipe 178 is thermally coupled and attached to the extruded metal support structure 184 by either an intimate mechanical fit, brazing, soldering, or using a layer of a thermally conductive material or adhesive. The serpentine water cooling pipe 178 and the support structure 184 could form an intimate mechanical fit through either forcing the serpentine water cooling pipe 178 into the channel in the extruded metal support structure 184 or by subsequently expanding the water cooling pipe 178 against the channel in the extruded metal support structure 184. The extruded metal support structure allows for relaxed tolerances for bending the serpentine water pipe 178 and provides a flat surface for the thermal interface material 191 to the heat spreader 173, FIG. 11B. As described above, a thermal interface material 191, preferably a compliant non-adhesive material such as a thermal pad or gap fill material, can be used between the heat spreader 173 and the extruded metal support structure 184 or 190 to lower the thermal resistance. The use of a flat thermal interface between the support structure 184 and the heat spreader 173 reduces the alignment tolerances between the locations of the connectors 144 for the circuit card assemblies 175 and the thermal interfaces.

Referring to FIG. 10, connectors 152 on circuit card assembly 175 connect with the mating half 144 on mother board 48. Connectors 144 and 152 normally have about two millimeters of vertical motion after connection is made. Serpentine water 178 and support structures 176, 184, or 190 (FIGS. 8 & 11) are mounted at a height such that heat spreader 173 engages and compresses thermal interface material 191 (FIG. 11B) to an appropriate amount, between 10% and 50% for a gap fill pad, or if a TIM 191 is not used, bottoms out (i.e., are fully engaged and no further vertical motion towards each other is possible) on the support structure 176,184, or 190 about 1 millimeters before connectors 144 and 152 bottom out. In this manner approximately plus or minus 0.5 millimeter height tolerance is taken up and allows the gap fill material or thermal pad material 191 to fully compress for maximum heat transfer capability, if such a material is used. The direction of compressing the TIM layer 191 is identical with the direction of actuating the electrical connectors 144 and 152 and that these actions are performed simultaneously. As in FIG. 8, the ends of the circuit card assemblies 175 can overlap (not shown in FIG. 10) which allows for a more compact and lower cost mother card 48 and compute rack (not shown).

Referring to FIG. 11A, a detail of the embodiment of the extruded metal support structure 184 having an upward facing channel (FIG. 10) is shown. The serpentine pipe 178 is recessed sufficiently in the channel in 184 that the heat spreader 173 is contacting the flat surfaces on the top surface of the extruded metal support structure 184 rather than the serpentine pipe 178. As an alternative, the top surface of the serpentine pipe 178 can be flush with the flat top surfaces of the extruded metal support structure 184 when the pipe is mechanically forced into the channel. Mechanically fasteners 188 pass through holes 174 (FIG. 7) in heat spreader 173, and join the circuit card assembly 175 to the extruded metal support structure 184. Other means of attachment could also be used, for example, springs could be incorporated with the fasteners 188 to provide a constant load if so desired. An alternate version of the extruded metal support structure is shown in FIG. 11B where the channel containing the serpentine cooling pipe 178 is located in a channel facing downwardly on a bottom surface of an alternative extruded metal support structure 190 rather than in the channel facing upwardly on a top surface of the extruded metal support structure 184 as shown in FIG. 11A.

Additional heat producing components on the mother card 48 may also need to be cooled and may include DC-DC converters and other power conditioning components 186, shown in FIGS. 10, 11A and 11B. These are cooled by being thermally coupled to the extruded metal support structure, upward facing channel 184 or downward facing channel 190. In the cooling apparatus configuration shown in FIG. 11B, an additional power component heat spreader 192 is added as shown. Thermal interface material layers may be added between the surfaces as necessary. The cooling apparatus configuration previously discussed referring to FIGS. 8 and 9, may also include DC-DC conversion components and other power conditioning components 186 (shown in FIGS. 11A, 11B), which may be cooled through the node support structure 182. Similarly with the cooling apparatus configurations shown in FIGS. 8 and 9, the cooling path for the heat generated by chip packages 132 and 134 is through the heat spreaders (or heat transfer devices) 171 and 173, through the extruded metal support structure 184 or 190, and then to the serpentine water pipe 178.

Figure 12:
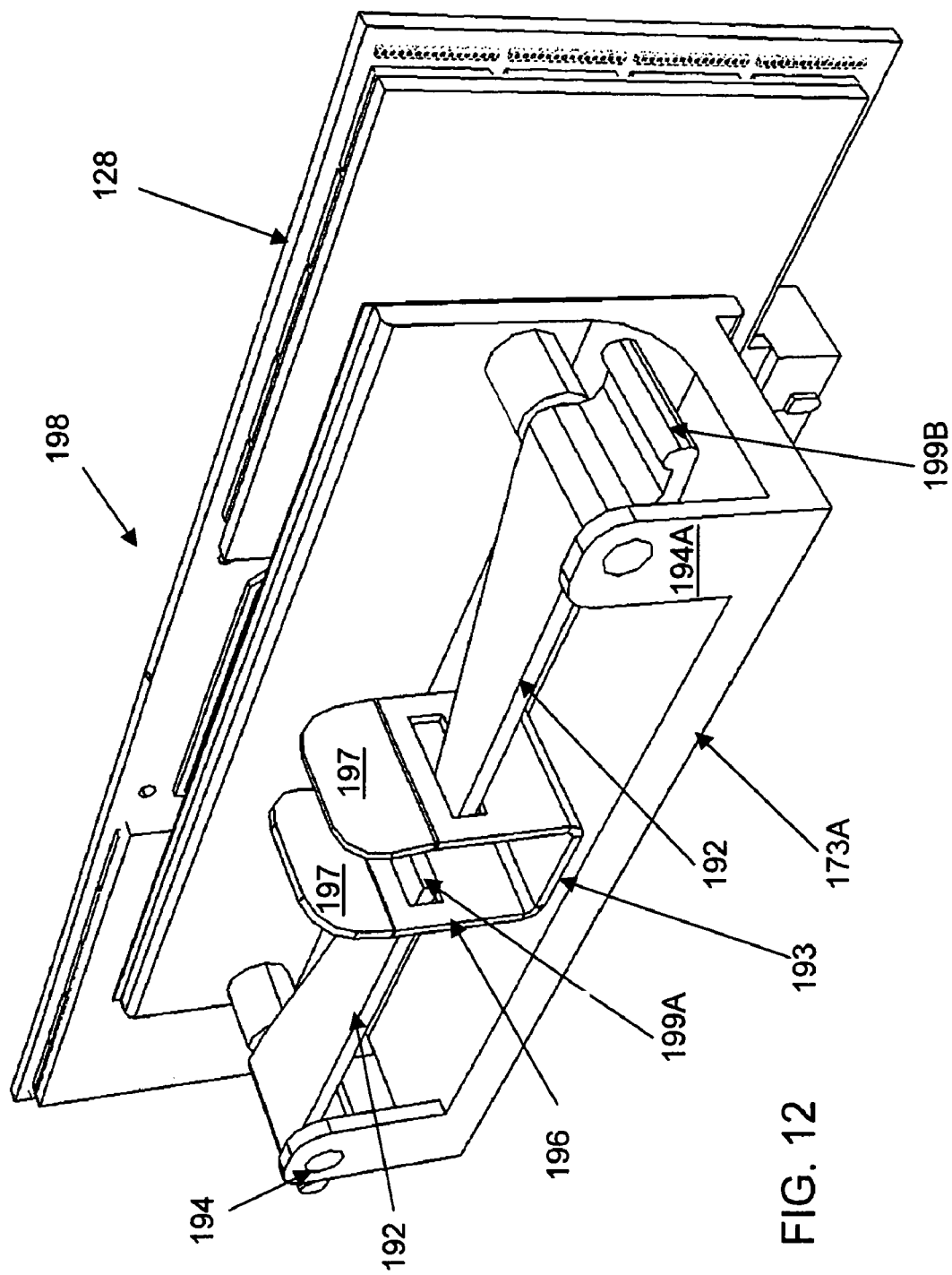
FIG. 12 is a perspective view illustrating the circuit card assembly shown in FIG. 7 further including an integrated individual latching mechanism.

Referring to FIGS. 12 and 13, an embodiment according to the invention of individual integrated latching mechanisms for use with the cooling apparatuses shown in FIGS. 7-11B are shown. A circuit card assembly 198 (similar to assembly 175 shown in FIG. 7) includes the addition of an integrated individual latching mechanism 193 where the latches 192 are each attached to a pivot axis 194, and the latching mechanism 193 includes a latch release 196. A heat spreader 173A is modified in relation to the heat spreader 173 shown in FIG. 7 to accommodate the integrated latch mechanism 193, for example, an arm 194A accommodating pivot axis 194.

Referring to FIG. 13, the integrated individual latching mechanisms 193 are used to secure the circuit card assemblies to the support structure. Latch receivers 200 are attached to the pipe support structure 176 to receive the ends 199B of the latches 192 which project beyond the pivot axis 194. To release the integrated individual latch mechanism 193, the vertical tabs 197 of the latch release 196 are compressed toward each other, freeing the opposing ends 199A of the latches 192. The latches 192 then can be raised so that opposite ends 199B of the latches 192 from the opposing ends 199A which extend beyond the pivot axis 194 no longer engage with the latch receivers 200 mounted on the pipe support structure 176 (shown in FIG. 13).

Disengaging the latch receivers 200 allow the circuit card assembly 198 with the integrated latch 193 to be removed from the mother card 48 (not visible through the node support structure 182). Similarly, the latch mechanism can be activated by plugging the assembly 198 into it's corresponding connector on the mother card with the latches raised so that the latch ends clear the latch receivers 200, and then pressing down on the latches so that they engage against the latch receivers 200 and are held in place by the latch release 196. The use of such an integrated individual latch mechanism 193 significantly reduces the labor required to assemble all the circuit card assemblies 198 to the mother card 48 (shown in FIGS. 8 and 10).

Thus, a cooling apparatus, and system and method for cooling a heat producing electronic device according to the present invention is provided in the embodiments of the invention described herein. The cooling apparatus of the present invention comprises at least one heat producing electronic device such as the circuit card 128 shown in FIG. 7, which includes chip packages 132 and 134 and connector header 152. Heat transfer devices such as the heat spreaders 171, 173 (shown in FIG. 7), or similar heat spreaders such as 130, or other described configurations, are connected to the heat producing electronic device and thermally communicating with the heat producing device for transferring heat from the heat producing device to the heat transfer device. A heat conduit such as the serpentine water pipe 178 shown in FIG. 8 is supported by the support structure 176, which communicates with the heat spreader 173. The water pipe 178 circulates thermally conductive fluid, which may be a liquid such as water, and the fluid thermally communicates with the heat spreader 173 through the pipe support structure 176, 184 or 190 for transferring heat to the fluid of the water pipe 178 from the heat spreader 173.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

What is claimed is:

1. A cooling apparatus for an electronic device, comprising:
    a plurality of heat producing electronic devices affixed to a wiring substrate, the heat producing electronic devices each including outer edges, a raised portion and an unraised portion;
    a plurality of heat transfer assemblies each including a first thermal interface communicating with the unraised portion and adjacent an outer edge of the heat producing electronic devices, and a second thermal interface communicating with the raised portion of the heat producing electronic devices, the second thermal interface having outer edges wherein an outer edge of the second thermal interface and a side outer edge of the heat producing electronic device define a region therebetween on the unraised portion;
    heat spreaders being part of the heat transfer assemblies and thermally communicating with and coupled to the second thermal interfaces of the heat transfer assemblies, the heat transfer assemblies thermally communicating with the heat producing electronic devices for transferring heat from the heat producing electronic devices to the heat transfer assemblies, the plurality of heat producing electronic devices and respective heat transfer assemblies being positioned on the wiring substrate having the regions at least partially overlapping;
    a heat conduit thermally communicating with the heat transfer assemblies, the heat conduit circulating thermally conductive fluid therethrough in a closed loop for transferring heat to the fluid from the heat transfer assemblies via the heat spreader;
    a thermally conductive support structure supporting the heat conduit, the support structure thermally communicating with the heat transfer assemblies via the heat spreaders for transferring heat to the fluid of the heat conduit from the support structure;
    wherein the support structure and the heat spreaders of the thermal transfer assemblies mechanically mate and thermally couple for transferring heat from the heat spreaders to the support structure;
    wherein the heat conduit is a serpentine pipe, and the serpentine pipe and the support structure wind between rows of the heat transfer assemblies coupled to the heat producing electronic devices for a specified distance, such that the heat conduit extends in mating relation with the support structure along the specified distance; and
    the support structure including a base portion being beneath the heat producing electronic devices, the heat transfer assemblies, and the heat conduit, and the base portion of the support structure being configured to not be in overlapping relation with the heat producing electronic devices.

2. The apparatus of claim 1, wherein the heat producing electronic devices have two sides with chips on both sides and the heat transfer assemblies communicate with one side of the heat producing device.

3. The apparatus of claim 1, wherein the heat generating producing electronic devices include a raised center portion and two unraised side portions at opposite ends of the heat producing electronic devices, two first thermal interfaces communicate with the unraised portions and each first thermal interface being adjacent an outer side edge of the heat producing electronic devices, and opposite outer edges of the second thermal interface and the opposite side edges of the heat producing electronic devices defining opposite end regions therebetween, the plurality of heat producing electronic devices and respective heat transfer assemblies being positioned on the wiring substrate having end regions at least partially overlapping.

4. The apparatus of claim 1, further including:
a clamping device positioned on the heat spreaders and removably coupling with the support structure for applying downward pressure for clamping the heat spreaders to the support structure.

5. The apparatus of claim 4, wherein the heat producing electronic devices mate electronically with receptacles on the wiring substrate, and the clamping devices are biased to apply pressure when in a locked position to a joint between the heat spreaders and the support structure, and a force towards the receptacle such that the mated heat producing devices engage the receptacles without reaching a bottom position.

6. The apparatus of claim 5, wherein thermal interfaces between the support structure and the heat spreaders are planar.

7. The apparatus of claim 1, wherein the support structure further includes a channel extending above the base portion of the support structure, and the channel captures the heat conduit.

8. The apparatus of claim 1, wherein the heat producing electronic devices are first heat producing electronic devices, and the apparatus further includes:
a plurality of second heat producing electronic devices affixed to the wiring substrate and the support structure thermally communicating with the second heat producing electronic devices for transferring heat to the circulating fluid from the support structure.

9. The apparatus of claim 1, further including thermal interface elements between the heat producing electronic devices and the first thermal interface and between the first thermal interface and the heat spreaders.

10. The apparatus of claim 9, further including thermal interface elements between the heat spreaders and the support structure.

11. The apparatus of claim 1, wherein the heat transfer assemblies face in opposite directions in relation to their adjacent heat transfer assemblies in a row of heat transfer assembles.

12. A cooling system for an electronic device, comprising:
a plurality of first heat producing electronic devices affixed to a wiring substrate, the first heat producing electronic devices each including outer edges, a raised portion and an unraised portion;
a plurality of second heat producing electronic devices affixed to the wiring substrate and being angularly juxtapositioned with the first heat producing electronic devices;
a plurality of heat transfer assemblies each including a first thermal interface communicating with the unraised portion and adjacent an outer edge of the first heat producing electronic devices, and a second thermal interface communicating with the raised portion of the first heat producing electronic devices, the second thermal interface having outer edges wherein an outer edge of the second thermal interface and a side outer edge of the first heat producing electronic device define a region therebetween on the unraised portion;
heat spreaders being part of the heat transfer assemblies and thermally communicating with and coupling to the second thermal interfaces of the heat transfer assemblies, the heat transfer assemblies thermally communicating with the first heat producing electronic devices for transferring heat from the first heat producing electronic devices to the heat transfer assemblies, the plurality of first heat producing electronic devices and respective heat transfer assemblies being positioned on the wiring substrate having the regions at least partially overlapping;
a heat conduit thermally communicating with the heat transfer assemblies, the heat conduit circulating thermally conductive fluid therethrough in a closed loop for transferring heat to the fluid from the heat transfer assemblies via the heat spreaders;
a thermally conductive support structure supporting the heat conduit, the support structure thermally communicating with the heat transfer assemblies via the heat spreaders for transferring heat to the fluid of the heat conduit from the support structure, and the support structure and the heat spreaders of the thermal transfer assemblies mechanically mating and thermally coupling for transferring heat from the heat spreaders to the support structure, the support structure being positioned over the second heat producing electronic devices and thermally communicating with the second heat producing electronic devices for transferring heat to the fluid from the support structure;
wherein the heat conduit is a serpentine pipe, and the serpentine pipe and the support structure wind between rows of the heat transfer assemblies coupled to the first heat producing electronic devices for a specified distance, such that the heat conduit extends in mating relation with the support structure along the specified distance; and
the support structure including a base portion being beneath the plurality of first heat producing electronic devices, the heat transfer assemblies, and the heat conduit, and the base portion of the support structure being configured to not be in overlapping relation with the first heat producing electronic devices.

13. The apparatus of claim 12, wherein the first heat producing devices mate electronically with receptacles on the wiring substrate, and clamping devices are positioned on the heat spreaders and removably coupled with the support structure for applying downward pressure for clamping the heat spreaders to the support structure, and the clamping devices are biased to apply pressure when in a locked position to a joint between the heat spreaders and the support structure and applying a force towards the receptacle such that the mated heat producing devices engage the receptacles without reaching a bottom position, and the heat conduit and the support structure wind between rows of heat transfer assemblies coupled to the first heat producing electronic devices.

14. A system for supporting a heat conduit for cooling electronic devices, comprising:
a plurality of heat producing electronic devices affixed to a wiring substrate; a plurality of heat transfer assemblies each including a heat spreader thermally communicating with and coupling to the heat producing electronic devices for transferring heat from the heat producing electronic devices to the heat transfer assemblies, the plurality of heat producing electronic devices and respective heat transfer assemblies being positioned on the wiring substrate;

a heat conduit thermally communicating with the heat transfer assemblies, the heat conduit circulating thermally conductive fluid therethrough in a closed loop for transferring heat to the fluid from the heat transfer assemblies;

a thermally conductive support structure supporting the heat conduit, the support structure thermally communicating with the heat transfer assemblies for transferring heat to the fluid of the heat conduit from the support structure, and the support structure and the heat spreaders of the thermal transfer assemblies mechanically mating and thermally coupling for transferring heat from the heat spreaders to the support structure, the heat conduit and the support structure wind between rows of the heat transfer assemblies coupled to the heat producing electronic devices and the support structure captures the heat conduit in a channel in the support structure;

wherein the heat conduit is a serpentine pipe, and the serpentine pipe and the support structure wind between rows of the heat transfer assemblies coupled to the heat producing electronic devices for a specified distance, such that the heat conduit extends in mating relation with the support structure along the specified distance;

the support structure includes a base portion being beneath the heat producing electronic devices, the heat transfer assemblies, and the heat conduit, and the base portion of the support structure being configured to not be in overlapping relation with the heat producing electronic devices.

15. The system of claim 14, further including:
a plurality of second heat producing electronic devices affixed to the wiring substrate and being angularly juxtapositioned with the first heat producing electronic devices and the support structure being positioned over the second heat producing electronic devices and thermally communicating with the second heat producing electronic devices for transferring heat to the fluid from the support structure.

16. The system of claim 14, wherein the channel in the support structure faces upward.

17. The system of claim 14, wherein the channel in the support structure faces downward.

18. A method for cooling an electronic device, comprising:
providing a plurality of first heat producing electronic devices affixed to a wiring substrate;
providing a plurality of second heat producing electronic devices affixed to the wiring substrate and being angularly juxtapositioned with the first heat producing electronic devices;
providing a plurality of heat transfer assemblies each including a first thermal interface communicating with a portion of the first heat producing electronic devices, and a second thermal interface communicating with another portion of the first heat producing electronic devices, the second thermal interface having outer edges wherein an outer edge of the second thermal interface and a side outer edge of the first heat producing electronic device define a region therebetween, heat spreaders being part of the heat transfer assemblies and thermally communicating with and coupling to the second thermal interfaces of the heat transfer assemblies, the heat transfer assemblies thermally communicating with the first heat producing electronic devices for transferring heat from the first heat producing electronic devices to the heat transfer assemblies,
positioning the plurality of first heat producing electronic devices and respective heat transfer assemblies on the wiring substrate;
overlapping, at least partially, the regions of the first heat producing electronic devices;
positioning a heat conduit in thermal communication with the heat transfer assemblies;
circulating thermally conductive fluid through the heat conduit in a closed loop for transferring heat to the fluid from the heat transfer assemblies via the heat spreader; and
positioning a thermally conductive support structure under the heat conduit, the support structure thermally communicating with the heat transfer assemblies via the heat spreaders for transferring heat to the fluid of the heat conduit from the support structure;
coupling, mechanically and thermally, the support structure and the heat spreaders of the thermal transfer assemblies for transferring heat from the heat spreaders to the support structure;
positioning the support structure over the second heat producing electronic devices and thermally communicating with the second heat producing electronic devices for transferring heat to the fluid from the support structure;
wherein the heat conduit is a serpentine pipe, and the serpentine pipe and the support structure wind between rows of the heat transfer assemblies coupled to the first heat producing electronic devices for a specified distance, such that the heat conduit extends in mating relation with the support structure along the specified distance;
positioning a base portion of the support structure beneath the first heat producing electronic devices, the heat transfer assemblies, and the heat conduit; and
configuring the base portion of the support structure to not be in overlapping relation with the first heat producing electronic devices.

\* \* \* \* \*